United States Patent [19]
Chevallier

[11] Patent Number: 5,890,193
[45] Date of Patent: Mar. 30, 1999

[54] ARCHITECTURE FOR STATE MACHINE FOR CONTROLLING INTERNAL OPERATIONS OF FLASH MEMORY

[75] Inventor: Christophe J. Chevallier, Palo Alto, Calif.

[73] Assignee: Micron Technology, Inc., Santa Clara, Calif.

[21] Appl. No.: 956,759

[22] Filed: Oct. 22, 1997

Related U.S. Application Data

[63] Continuation of Ser. No. 508,974, Jul. 28, 1995, abandoned.

[51] Int. Cl.$^6$ .................................................. G11C 16/02
[52] U.S. Cl. ........................................... 711/103; 365/218
[58] Field of Search ........................ 365/185.29, 185.33, 365/218; 711/103

[56] References Cited

U.S. PATENT DOCUMENTS

| | | | |
|---|---|---|---|
| 5,327,383 | 7/1994 | Merchant et al. | 365/218 |
| 5,333,300 | 7/1994 | Fandrich | 395/430 |
| 5,448,712 | 9/1995 | Kynett et al. | 395/430 |
| 5,463,757 | 10/1995 | Fandrich et al. | 395/430 |
| 5,509,134 | 4/1996 | Fandrich et al. | 395/430 |

Primary Examiner—Eddie P. Chan
Assistant Examiner—Gary J. Portka
Attorney, Agent, or Firm—Schwegman, Lundberg, Woessner & Kluth, P.A.

[57] ABSTRACT

An architecture for a state machine used to control the data processing operations performed on the memory cells contained in a memory array. The architecture is designed to control the performance of the operations and sub-operations used to erase and program the memory array. The architecture of the present invention does not utilize separate state machines for each primary operation, but instead is based on a single state machine which is capable of controlling the various functions common to the data processing operations carried out on the memory cells. A sequencer which acts upon commands input from an external microprocessor is used to determine which set of sub-operations or functions needs to be performed to implement the commanded operation. The sequencer activates a timer which acts to trigger the functions controlled by a loop controller as they are needed for a particular operation. The sequencer provides input signals to the loop controller which are used to determine the parameters of the signals generated by the loop controller. These signals are used to control the high voltage supplies which produce the pulses for erasing or programming the cells and other modules used during the data processing operations.

16 Claims, 12 Drawing Sheets

PROGRAM STATE MACHINE

| EXTERNAL OPERATION: | | PROGRAM | ERASE | | | |
|---|---|---|---|---|---|---|
| STEP | CIRCUITRY AFFECTED | PROGRAM | PRE-PROGRAM WITHOUT VERIFY | PRE-PROGRAM WITH VERIFY | INTERNAL ERASE | Post-ERASE PROCESSING |
| INITIALIZE | ADDRESS COUNTER, PULSE COUNTER | ADDRESS=0 PULSE=0 | ADDRESS=0 PULSE=0 | ADDRESS=0 PULSE=0 | ADDRESS=0 PULSE=0 | PULSE=0 |
| SETUP HV | HV SUPPLIES, REGULATORS | Vpx=11V Vpy=6V | Vpx=11V Vpy=6V | Vpx=11V Vpy=6V | Vsource= 10V | Vpx=11V |
| ACTIVE HV PULSE | TIMERS | 6 us PULSE | 6 us PULSE | 6 us PULSE | 10 us PULSE | 100 ms pulse |
| SETUP VERIFY | HV SUPPLIES, REGULATORS | Vpx=6V Vpy=OFF | Vpx=Vcc Vpy=OFF | Vpx=6V Vpy=OFF | Vpx=Vcc Vpy=OFF | Vpx=Vcc Vpy=OFF |
| COMPARE | SENSE AMPS, LOGIC | COMPARE TO INPUT DATA | FORCE dataOK=1 | COMPARE TO 00 | COMPARE TO FF | FORCE dataOK=1 |
| INCREMENT PULSE | PULSE COUNTER | PULSE MAX=64 | NA | PULSE MAX=64 | PULSE MAX=1024 | NA |
| INCREMENT ADDRESS | ADDRESS COUNTER | ADDRESS MAX=1 | ADDRESS MAX=END OF BLOCK | ADDRESS MAX=END OF BLOCK | ADDRESS MAX=END OF BLOCK | ADDRESS MAX=1 |
| SUSPEND | SUSPEND LATCH | NOT APPLICABLE | | | | |
| EXIT | RESET/ SEQUENCER | WHEN ADDRESS MAX IS REACHED, PROGRAM IS COMPLETED | WHEN ADDRESS MAX IS REACHED, GOTO INTERNAL ERASE | WHEN ADDRESS MAX IS REACHED, GOTO INTERNAL ERASE | WHEN ADDRESS MAX IS REACHED, GOTO Post-Erase | WHEN ADDRESS MAX IS REACHED, ERASE IS COMPLETED |

FIG. 12

ARCHITECTURE FOR STATE MACHINE FOR CONTROLLING INTERNAL OPERATIONS OF FLASH MEMORY

This is a continuation of application Ser. No. 08/508,974 filed on Jul. 28, 1995 now abandoned.

TECHNICAL FIELD

The present invention relates to flash memory systems, and more specifically, to an architecture for a state machine used to control the internal data processing operations of a flash memory. The state machine uses a central controller to control the execution of the sub-operations common to the data processing operations. The state machine of the present invention has fewer logic gates and is more compact than the set of state machines currently used for such purposes.

BACKGROUND OF THE INVENTION

In early integrated circuit memory systems, the detailed operation of the memory system was controlled directly by a processor unit which utilized the memory. Since the operation of many memory systems requires a substantial amount of processor overhead, many such systems now include an internal state machine for controlling the detailed operation of the memory system. The internal state machine controls the primary operations of the memory system, including the reading, programming and erasing operations performed on the memory elements. Each of these primary operations is comprised of a large number of sub-operations which are necessary to carry out the primary operations, with these suboperations also being controlled by the primary state machine or in some cases by a secondary one.

FIG. 1 is a functional block diagram of a conventional flash memory system 100. The core of memory system 100 is an array 112 of flash memory cells. The individual cells in array 112 are arranged in rows and columns, with there being, for example, a total of 256K eight bit words in array 112. The individual memory cells (not shown) are accessed by using an eighteen bit address A0–A17, which is input by means of address pins 113. Nine of the eighteen address bits are used by X decoder 114 to select the row of array 112 in which a desired memory cell is located and the remaining nine bits are used by Y decoder 116 to select the appropriate column of array 112 in which the desired cell is located. Sense amplifiers 119 are used to read the data contained in a memory cell during a read operation or a data verification step in which the state of a cell is determined after a programming, pre-programming, or erase operation. This circuitry can be combined with the data compare and verify circuits used to compare the state of a cell to a desired state or to input data.

Memory system 100 contains an internal state machine (ISM) 120 which controls the data processing operations and sub-operations performed on memory array 112. These include the steps necessary for carrying out programming, reading and erasing operations on the memory cells of array 112. In addition, internal state machine 120 controls such operations as reading or clearing status register 126, identifying memory system 100 in response to an identification command, and suspending an erase operation. State machine 120 functions to reduce the overhead required of an external processor (not depicted) typically used in association with memory system 100.

For example, if memory cell array 112 is to be erased (typically, all or large blocks of cells are erased at the same time), the external processor causes the output enable pin $\overline{OE}$ to be inactive (high), and the chip enable $\overline{CE}$ and write enable $\overline{WE}$ pins to be active (low). The processor then issues an 8 bit command 20H (0010 0000) on data I/O pins 115 (DQ0–DQ7), typically called an Erase Setup command. This is followed by the issuance of a second eight bit command D0H (1101 0000), typically called an Erase Confirm command. Two separate commands are used to initiate the erase operation so as to minimize the possibility of inadvertently beginning an erase procedure.

The commands issued on I/O pins 115 are transferred to data input buffer 122 and then to command execution logic unit 124. Command execution logic unit 124 receives and interprets the commands which instruct state machine 120 to initiate the steps required for erasing array 112 or carrying out another desired operation. Once the desired operation sequence is completed, state machine 120 updates 8 bit status register 126. The contents of status register 126 is transferred to data output buffer 128, which makes the contents available on data I/O pins 115 of memory system 100. Status register 126 permits the external processor to monitor certain aspects of the status of state machine 120 during memory array write and erase operations. The external processor periodically polls data I/O pins 115 to read the contents of status register 126 in order to determine whether an erase sequence (or other operation) has been completed and whether the operation was successful.

FIG. 2 is a state diagram showing the states of an erase state machine during the performance of an erase operation on a memory system such as that shown in FIG. 1. As indicated by the figure, an erase operation includes pre-program 200, high voltage (internal) erase 220, and erase healing (distribution adjustment) 240 stages. As shown in the figure, each of these primary stages in an erase operation is typically implemented in the form of a separate state machine.

The erase operation begins with an erase set-up stage 260 which is initiated by application of the appropriate commands on data I/O pins 115 (DQ0–DQ7) of FIG. 1, and any other appropriate control signals applied on the relevant lines. The function of stage 260 is to set up a node that indicates that the part is being erased. From this state, the state machine either transitions to pre-program state 200 along path 262, or if instructed to skip that stage, along path 264. If the state machine transitions to the pre-program stage, pre-program state machine 200 then carries out that operation. This sub-operation programs all the elements in the memory array to a logic 0 value to make sure that the erase process starts from a known cell threshold voltage level. This part of the complete erase operation is used to reduce the possibility of over erasure of some of the memory elements during the later steps. When the pre-program operation has been completed on the memory elements, the erase state machine transitions along path 265 to the next stage, unless the state machine has been instructed to suspend the erase operation. If a problem occurs during the pre-program stage, control is passed out of that stage along path 263.

When the pre-program operation is complete, or if that operation was skipped, the erase state machine transitions to erase high voltage (internal erase) stage 220. As noted in FIG. 2, this stage is typically implemented in the form of a state machine. In the erase high voltage stage, the memory system performs a block erase operation on all of the cells contained in a block of memory. This has the effect of erasing all of the memory elements to a logic 1 value.

Upon successful completion of the high voltage erase operation, the erase state machine transitions to either the erase healing stage 240 or to the erase clean up stage 270. If the erase operation was successful and the heal operation has not been performed, the erase state machine transitions along path 266 to healing state machine 240. In the erase healing operation, the memory cells in the array are corrected (if necessary) for the effects of accidental over-erasure, in which case the threshold voltage of a cell has been driven down to zero or a negative value. When this operation has been completed for the block of memory elements which has been erased, the erase state machine transitions back along path 268 to the erase high voltage state machine 220. This is because the erase high voltage operation may need to be repeated to further adjust the threshold voltage levels of the memory cells after they have been altered by the healing operation. This cycle can be repeated until the erase high voltage operation and the healing operation have produced a desired range of threshold voltage levels. At that point, the erase state machine transitions along path 267 to erase clean up state 270. This stage is used to condition all internal nodes of the memory array to default values in order to prepare the memory system for the next operation. In addition, if an erase high voltage state error occurs, the state machine transitions along path 269 to erase clean up state 270.

FIG. 3 is a state diagram showing the states of the erase state machine of FIG. 2 in greater detail, and in particular the states of the pre-program, erase high voltage, and healing state machines shown in that figure. The pre-program cycle begins with pre-program state machine 200 initiating an operation which increments the address of the memory cell which is to be pre-programmed 202. This is done because the pre-programming operation is executed on a cell by cell basis. This step is followed by a high voltage level set-up stage 204 which prepares the system for application of the high voltage levels (typically, about 12 volts is applied to the gate of each memory cell and 6 volts to the drain) used for programming or erasing a cell. The high voltage level used for writing to (programming) the cell is then applied in stage 206.

The appropriate voltage levels for executing the data verification sequence (reading the data pre-programmed in the cell and comparing it to a desired value) are checked for at stage 208. This is followed by a program verification stage 210 which verifies that the programmed cell has sufficient margin. This is typically accomplished by reading the data stored in a cell and comparing it to a logic 0 value. If the verification operation was not successful, steps 204, 206, 208, and 210 are repeated. Once the verification stage for a particular memory cell is successfully completed, it is followed by a program clean up stage 212. Program clean up stage 212 conditions all internal nodes of the memory array to default values in order to prepare the memory system for the next operation. This concludes the pre-programming cycle for a given memory cell. The address of the cell to be operated on is then incremented at stage 202 and the process repeats itself until the last cell in a memory block to be erased is programmed. At this time, the incremented address will be set to the first address location in the block, which is the first address for the next operation. When this occurs, all of the memory cells have been successfully pre-programmed and control is passed to the erase high voltage state machine 220.

In the high voltage erase cycle, the memory system performs a block erase operation on all of the cells contained in a block of memory. The first stage in the cycle is a high voltage level set-up stage 222 which prepares the memory block for application of the high voltage pulse(es) used for erasing the cells. This is followed by a high voltage stage 224 in which a high voltage pulse is applied to erase all of the memory cells in the block of cells. This is followed by a set-up verify stage 226 which checks to see that the appropriate voltage levels for the data verification stage are present. The next stage is an erase verify stage 228 which verifies that the erase operation was successfully carried out on each cell in the block. This is accomplished by stepping through the cells, address by address and reading the data in a cell and comparing it to a logic value of 1.

If the erase operation was not successfully carried out (a cell was not erased to the proper threshold voltage margin to have the desired logic value), control is passed back to the high voltage level set-up stage 222 and the high voltage cycle is carried out again to erase the entire block of cells. If the erase operation was successful for the cell under consideration, the address of the memory cell is incremented 230 and the next cell is tested for verification of the erase operation. Thus, if the maximum address of the cells in the block of memory has not been reached, the erase verify stage is carried out on the next memory cell in the block. If the maximum address for cells in the block has been reached (meaning that all cells in the memory block have been successfully erased), control is passed to the distribution adjustment or healing state machine 240.

The distribution adjustment sub-operation 240 is used to tighten the distribution (reduce the variance) of the threshold voltages of the erased memory elements. The distribution adjustment or healing operation is implemented by applying high voltages (i.e., 12 volts) to the gates of all the memory cells in the memory block, with the memory cell drains floating and the sources at ground potential. This is designed to compensate for the effects of over erasure of any of the memory cells and to tighten the distribution of threshold voltages of the cells. The distribution adjustment cycle begins with a high voltage set-up stage 242, which is followed by a high voltage stage 244 in which the voltages used to perform the healing operation are applied. This is followed by a set-up verification 246 stage which checks to see that the appropriate voltage levels for the data verification operation are present, and erase verification 248 stage which acts to insure that all of the erased cells are still in an erased state. If the erase verification procedure fails, a final erase 249 stage may be executed. In the final erase stage, a short erase pulse is applied to the cells in the block.

After completion of the healing cycle, control is passed back to the erase high voltage state machine 220 along path 268 of FIG. 2. The erase state machine then transitions to erase clean up state 270 of FIG. 2. Erase clean up stage 270 conditions all internal nodes of the memory array to default values in order to prepare the memory system for the next operation. At this point the erase operation is completed.

FIG. 4 is a state diagram showing the states of a program state machine during the performance of a programming operation on a memory system such as that shown in FIG. 1. It is noted that a programming operation can be carried out by following the states shown in the pre-program cycle of the complete erase operation of FIG. 3. In particular, stages 204 through 212 of FIG. 3 describe the primary functions carried out in a regular programming operation. As a program operation is typically carried out on a specific memory cell, the increment address state 202 used in the pre-program cycle to facilitate pre-programming of every cell in the memory array is not accessed.

Another difference between the programming and pre-programming operations is that in a programming operation, program verify state 210 is designed to read the programmed data and compare it to the input data, rather than to a logic value of 0, as in the pre-programming operation. Increment counter state 211 of FIG. 4 is used to increment the pulse counter in the event that the programming operation failed. This allows the state machine to track the number of voltage pulses applied to a cell when the programming operation is re-tried on that cell. If the maximum pulse count value has not been reached, the state machine transitions back to program level setup state 204 and the programming operation is tried again on that cell. If the maximum pulse count value has been reached, the state machine transitions to program clean up state 212.

It is noted that the distinct stages of the operation of the data processing operations performed on the memory cells shown in FIGS. 3 and 4 are typically implemented as separate circuits. Thus, the erase pulse control, program pulse control, and heal pulse control functions are usually executed by separate circuits, leading to the duplication of some of the functionality. The same situation occurs for erase verify stage 228 and program verify state 210, thus resulting in additional duplication of circuitry.

While the state machine architecture of FIGS. 2–4 can be used to control the programming and erase operations carried out on a memory cell, it does have significant disadvantages. Firstly, a separate state machine is typically used to perform each function, and as noted, in some cases sub-functions. Since each state machine is constructed from multiple logic gates, this means that an enormous number of gates are required to construct a complete state machine of this design. A direct implementation of the state machines shown in FIGS. 3 and 4 would require approximately 20–25 states, and with 20 logic gates per state, this would give a total of 400 to 500 gates for the entire state machine. As some of the operations carried out by different state machines are similar in function, this results in a duplication of some of the logic gates. For example, the stages of a pre-program operation largely duplicate those of a program operation, and the set-up and application of voltage pulses stages, the set-up verification and date verification stage are common at a functional level in both the programming and erase operations. This duplication of functions produces an inefficient, less compact, and more expensive design for the complete state machine.

A second disadvantage to the state machine architecture of FIGS. 2–4 is that it produces a basically linear or sequential process flow. By this is meant that each state machine contains a set of operations which are carried out in a prescribed order prior to passing control to the next state machine, with the state machines themselves being implemented in a prescribed order. This structure is related to the previously mentioned problem, as this process flow leads to the duplication of functions in the state machine and in the modules controlled by the state machine, such as timers and counters. A disadvantage of this organization is that it reduces the ability to vary the process flow in order to test a product or produce specialized parts.

What is desired is a state machine architecture for controlling the data processing operations performed on the memory cells of a memory array which is implemented in a more efficient and flexible manner than currently used architectures. These and other advantages of the present invention will be apparent to those skilled in the art upon a reading of the following Detailed Description of the Invention together with the drawings.

SUMMARY OF THE INVENTION

The present invention is directed to an architecture for a state machine used to control the data processing operations performed on the memory cells contained in a memory array. The architecture is designed to control the performance of the operations and sub-operations used to erase and program the memory array. The architecture of the present invention does not utilize separate state machines for each primary operation, but instead is based on a single state machine which is capable of controlling the various functions common to the data processing operations carried out on the memory cells.

The state machine of the present invention includes a sequencer module which acts upon commands input from an external microprocessor and determines which set of sub-operations or functions need to be performed to implement the commanded operation. The sequencer activates a timer which acts to trigger the functions controlled by a loop controller as they are needed for a particular operation. The sequencer provides input signals to the loop controller which are used to determine the parameters of the signals generated by the loop controller. The signals output from the loop controller are used to control the high voltage supplies which produce the pulses for erasing or programming the cells. The loop controller also provides an input signal which causes a pulse counter to increment the pulse count and an address counter to increment the cell address as required during the execution of a program or erase operation.

By using the sequencer to control the order in which each of several common functions is performed, the architecture of the state machine can be simplified compared to presently used state machines. This results in a reduction in the size, number of logic gates, and complexity of the state machine. It also produces a state machine in which the order of each of the functions or sub-operations can be varied as desired, rather than being required to follow a prescribed order which cannot be altered.

Further objects and advantages of the present invention will become apparent from the following detailed description and accompanying drawings.

BRIEF DESCRIPTION OF THE DRAWINGS

FIG. 12 is a table showing how the primary data processing operations performed on a memory system can be implemented by the common set of operations controlled by the state machine of the present invention.

DETAILED DESCRIPTION OF THE INVENTION

Figure 5:
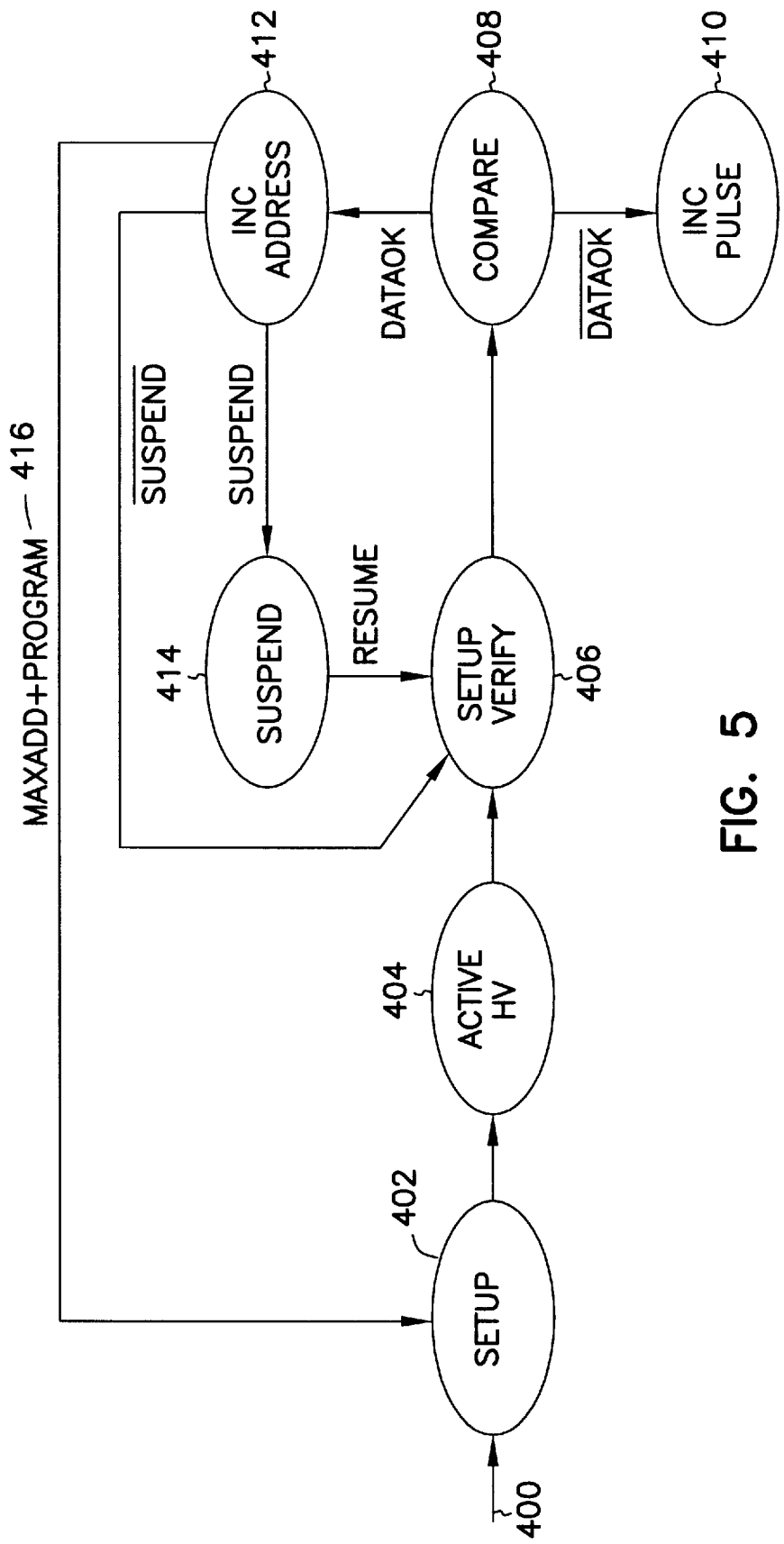
FIG. 5 is a flow diagram showing the process flow for the state machine of the present invention.

Referring again to the drawings, FIG. 5 is a flow diagram showing the process flow for the state machine of the present invention. The design of the state machine of the present invention is motivated by the recognition that there are certain common functions (high voltage set up, data verification, etc.) which are performed in both the erase and programming operations. Although the parameters of these functions (voltage levels, timing of pulse, data used in compare operation) may differ according to which high level operation is being executed, the functions can still be implemented by a common module whose outputs are determined by which operation (and what stage of that operation) is being executed.

FIG. 5 shows the primary sub-operations that are executed under the control of the state machine. As indicated by the preceding discussion, many of these sub-operations are common to more than one higher level operation which may be executed. By using a controller to determine which sub-operations are executed, the order of execution, and the input parameters for those operations, the process flow of FIG. 5 can be used to execute the higher level functions (such as programming or erasing) which are performed on the memory array. This allows a single state machine to be used to execute both a programming and erase operation, rather than separate state machines which duplicate some of the common functions.

As shown in FIG. 5, an input signal 400 initiates a high voltage setup operation 402, which in turn initiates a high voltage pulse operation 404. It is noted that high voltage pulses are used both for programming and erase operations, so that aspects of these operations can be implemented by a common high voltage pulse module. These steps are followed by a setup verify operation 406 which initiates a data compare operation 408. It is noted that both a setup verify and a data compare step are utilized in both a programming and erase operation, so that certain common aspects of the compare function can be implemented by a single module.

If the data compare operation indicates that the data contained in a memory cell is correct, an increment address operation 412 is executed. Depending upon the value of the incremented address and suspend command from a source external to the state machine, a suspend operation 414 may be executed. If the address has not reached a maximum address value, and if no suspend command has been issued, then the setup verify operation 406 is repeated. This branch would be used during an erase high voltage or heal cycle which is part of an erase operation to step through each cell while checking whether each cell in a block had been successfully erased. If the address value is a maximum and the state machine is executing a programming operation, then control signal 416 is issued and control is passed back to the setup operation 402 to prepare for the next command 400. If the result of the data comparison operation 408 indicates incorrect data, then an increase pulse operation 410 is executed to increment the pulse counter. This branch will start a new programming, pre-programming, or erase cycle since the previous cycle was unsuccessful. The increment pulse counter command produces a control signal which initiates the setup operation 402, thereby starting a new cycle.

In accordance with the present invention, it has been recognized that different combinations of these basic functions can be used to perform the data processing operations carried out on a memory cell of a memory array. For example, to program a memory cell, stages 402, 404, 406, 408, and 410 would be used. To pre-program a cell (without verification) during an erase operation of an entire block of cells, stages 402, 404, and 412 would be used. In order to produce an erase pulse and verify the erase operation, stages 402, 404, 406, 408, 410, 412, and 414 would be used. To execute a post-erase processing operation (such as healing or distribution tightening), stages 402 and 404 would be used, with the other stages being used if necessary. Furthermore, depending upon what operation (program, pre-program, erase, post-erase) is being executed, control signal 416 output by increment address stage 412 can be used to cause the state machine to transition to the next operation which is to be executed.

For instance, if control signal 416 issues while the state machine is in a program mode, then a Program OK output is produced. If control signal 416 issues while the state machine is in a pre-programming mode and the maximum address signal is high, then an erase high voltage operation (the next phase of an erase operation) is initiated. If control signal 416 issues while the state machine is in a heal mode, then an exit/reset command is issued.

As some of the sub-operations shown in FIG. 5 are common to both a program and an erase operation (as well as to the sub-operations which comprise an erase operation), a single functional module can be used to implement those sub-operations. The functions executed in the high voltage setup, high voltage pulse, data verification setup, and data verification stages, among others, are common to both a programming operation and to the pre-programming and high voltage erase stages of an erase operation. Although the precise parameters under which these stages are implemented may differ depending upon the operation being executed, there is enough commonality in function that the same functional module can be used.

In such a case, control signals can be used to instruct the module to vary its output as needed for the sub-operation being implemented. However, as noted, the same basic circuitry can be used when executing the sub-operation in either a programming or erase mode. By eliminating some of the duplicate circuitry normally found in the state machines used to control a memory system, this permits the use of a single state machine which is more compact and uses fewer logic gates to control the data processing operations of the memory system.

Figure 6:
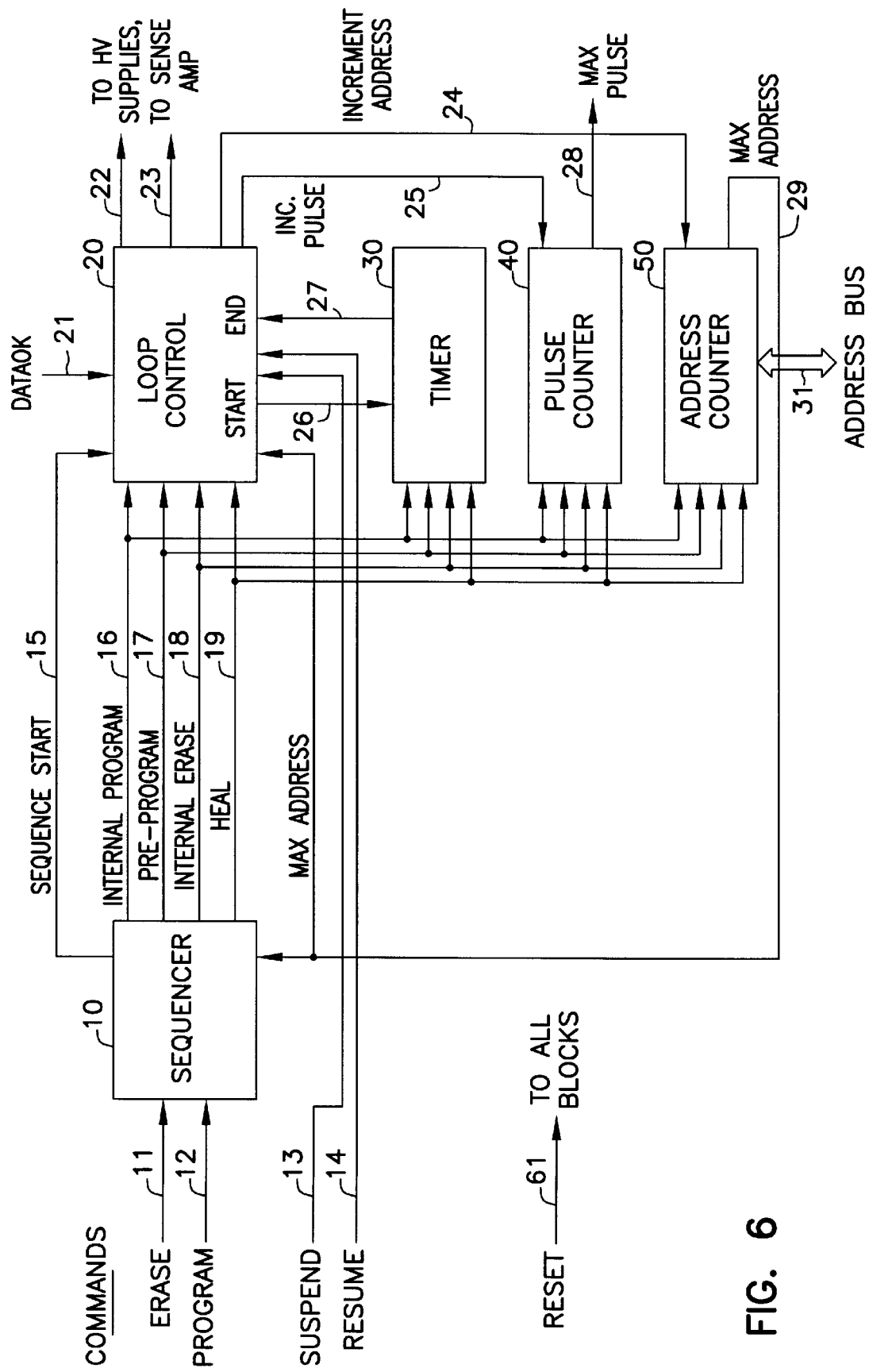
FIG. 6 is a block diagram of the state machine of the present invention.

FIG. 6 is a block diagram of the state machine 1 of the present invention. State machine 1 includes sequencer module 10 which has as inputs high level operation command signals 11 and 12 generated by an external controller or microprocessor. These command signals are typically in the form of an instruction to carry out a block erase operation on the memory cells of an array, or a programming operation on a specified memory cell.

Command signals 11 and 12 cause sequencer 10 to produce output signals which control the operation of loop controller module 20, timer module 30, pulse counter module 40, and address counter module 50. As will be described, these modules are used to execute the erase or programming operation by controlling the order and manner in which various functions used in those operations are performed.

The outputs of sequencer 10 are control signals which include a sequence start signal 15 that initiates loop controller circuit 20, and a control signal corresponding to the operation or sub-operation which is to be executed. These operations and sub-operations include the internal programming 16, pre-programming 17, internal erase 18, and healing 19 operations, where the pre-program, internal erase, and healing operations are part of an erase operation. As indicated by FIG. 6, the control signal(s) corresponding to the operation or sub-operation to be executed are also provided to timer module 30, pulse counter module 40, and address counter module 50.

Figure 1:
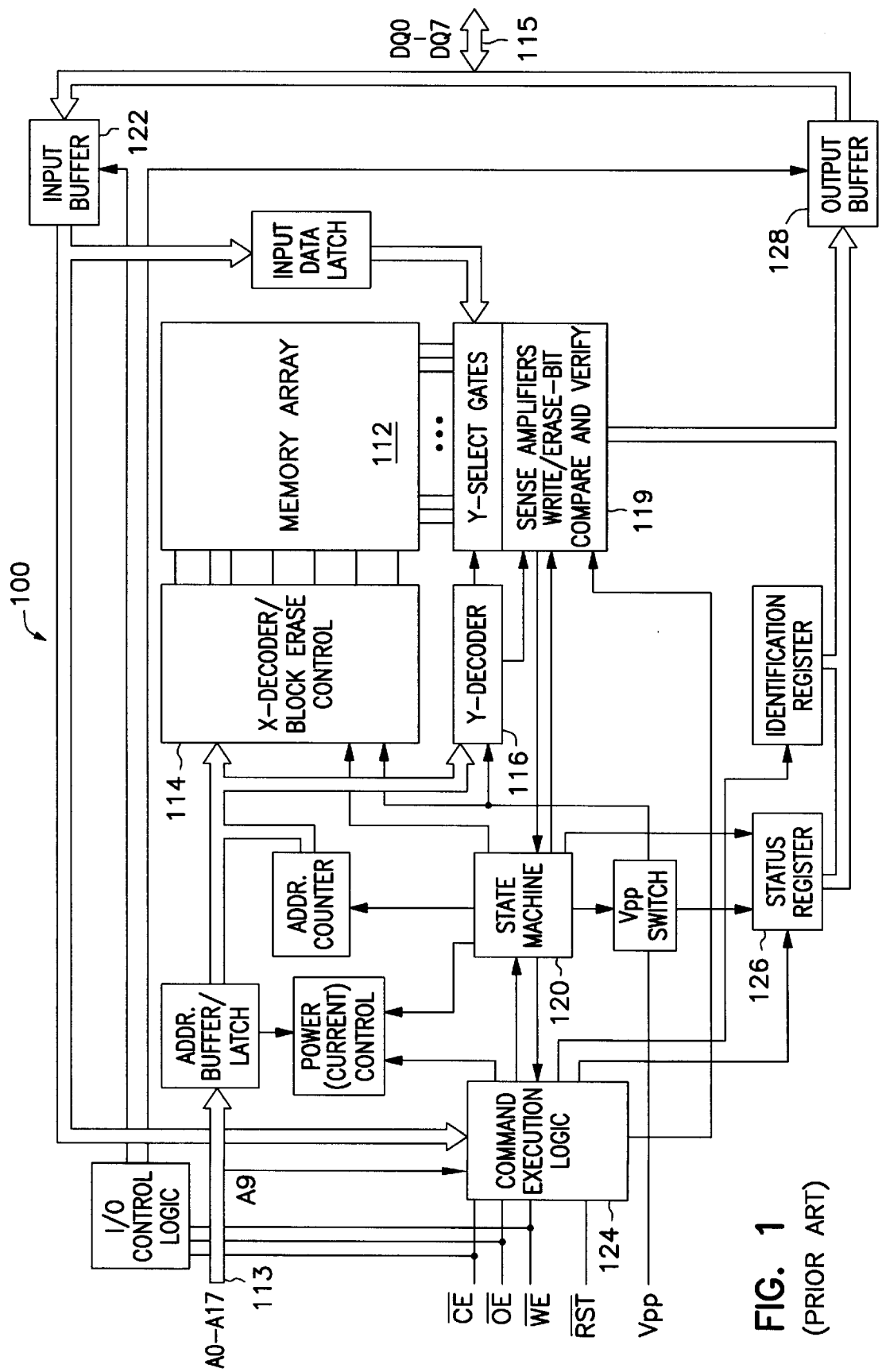
FIG. 1 is a functional block diagram of a conventional flash memory system.
Figure 2:
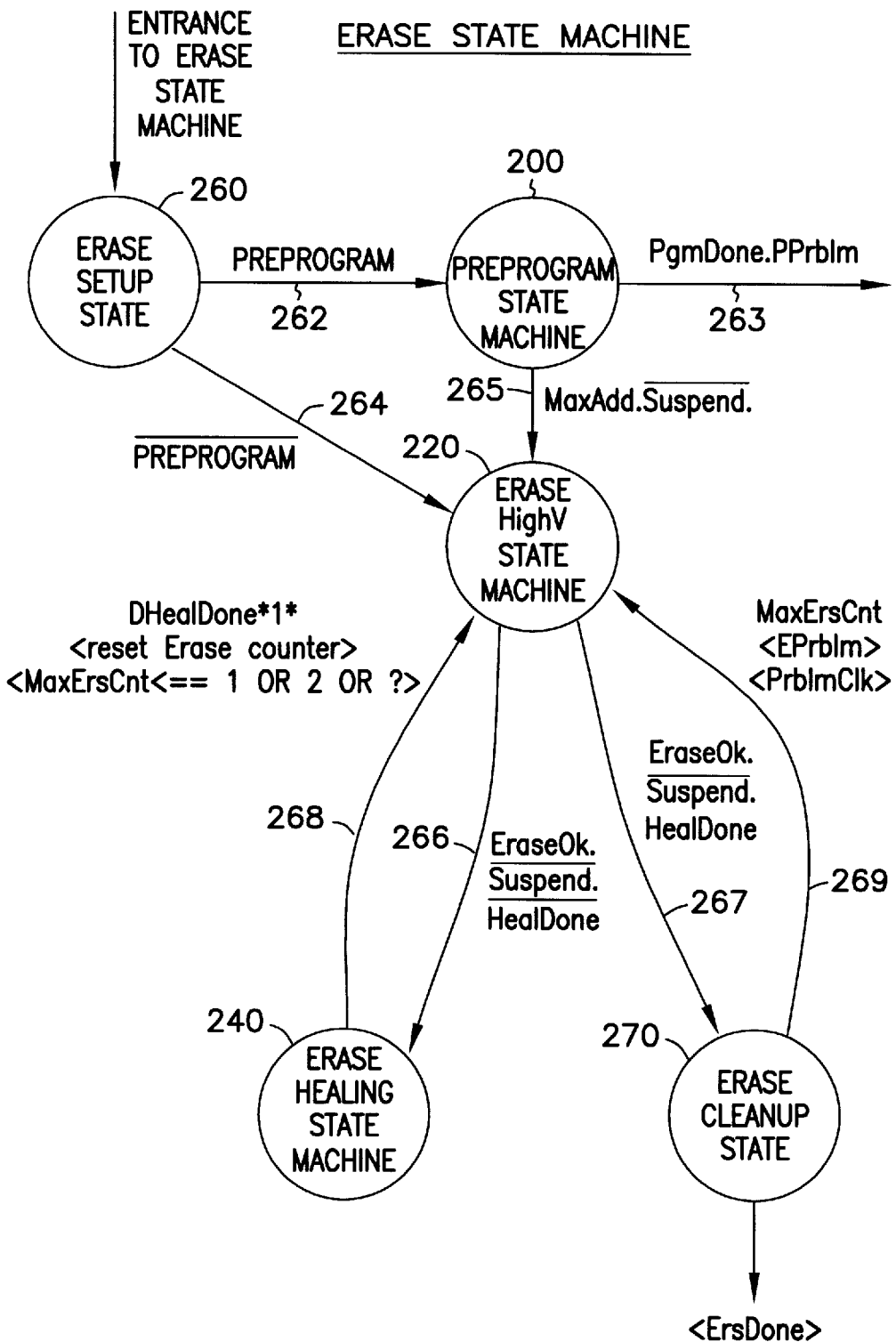
FIG. 2 is a state diagram showing the states of an erase state machine during the performance of an erase operation on a memory system such as that shown in FIG. 1.

As mentioned, loop controller 20 is activated by sequence start signal 15 issued by sequencer 10. Loop controller 20 contains circuitry which responds to the sequence start signal and the control signal indicating which operation or sub-operation is to be executed by generating the control signals 22 needed to cause the high voltage pulse generator circuits to produce a desired voltage pulse for programming or erasing a cell. Control signals 23 generated by loop controller 20 are used to control the sense amplifiers (see 119 of FIG. 1) which read the state of the memory cells during a read operation, and are used to read, compare, and verify the data in the cells during a programming, pre-programming, or erase operation.

Timer module 30 contains circuitry which produces an output pulse of variable duration. Timer module 30 receives a start signal 26 from loop controller 20 which initiates the timing circuitry. Start signal 26 causes the timing circuitry to initiate a timing sequence of duration determined by which control signal (16, 17, 18, or 19) is active. At the conclusion of the specified time period, timer module 30 outputs an end signal 27 to loop controller 20. End signal 27 causes loop controller 20 to terminate the operation or sub-operation whose execution it is controlling, and initiate a new operation. A description of the design and operation of a timer circuit suited for use in timer module 30 is found in U.S. patent application Ser. No. 08/509,035, entitled "Adjustable Timer Circuit" filed Jul. 28, 1995, now U.S. Pat. No. 5,629,644 and the contents of which are hereby incorporated in full by reference.

The control signals output by sequencer 10 are also provided as inputs to pulse counter module 40. Pulse counter module 40 also receives as an input increment pulse counter signal 25 from loop controller 20. The control signals from sequencer 10 set the pulse counter to the appropriate value based on the operation or sub-operation which is to be executed. During the execution of the operation or sub-operation, loop controller 20 outputs increment pulse counter signal 25 as required in accordance with the stage of execution of the operation (i.e., whether a sub-operation is to be re-executed). When the maximum pulse counter value (the value of which is determined by the input signal(s) from sequencer 10) has been reached, pulse counter module outputs a maximum pulse counter signal 28. This signal is used to terminate a program or erase operation to prevent an endless cycling through the operation.

The control signals output by sequencer 10 are also provided as inputs to address counter module 50. Address counter module 50 also receives as an input increment address counter signal 24 from loop controller 20. The control signals from sequencer 10 sets the address counter to the appropriate value based on the operation or sub-operation which is to be executed. During the execution of the operation or sub-operation, loop controller 20 outputs the increment address counter signal 24 as required in accordance with the stage of execution of the operation (i.e., to increment the address of the cell being pre-programmed or whose contents is being verified). When the maximum address counter value (the value of which is determined by the input signal(s) from sequencer 10) has been reached, address counter module outputs a maximum address counter signal 29. This signal is input to sequencer 10 and is used to indicate that the operation being executed has been completed.

A further use of the increment pulse counter and increment address counter signals is as part of a control scheme for terminating an operation. By appropriately setting the maximum address and pulse counter values, the increment counter signals can be used to increment the counters to those maximum values after a single cycle (or any desired number of cycles). This allows execution of only part of the sequence of operations that would normally occur, and is part of the control scheme that allows using the same functional modules for executing the high level operations.

Figure 7:
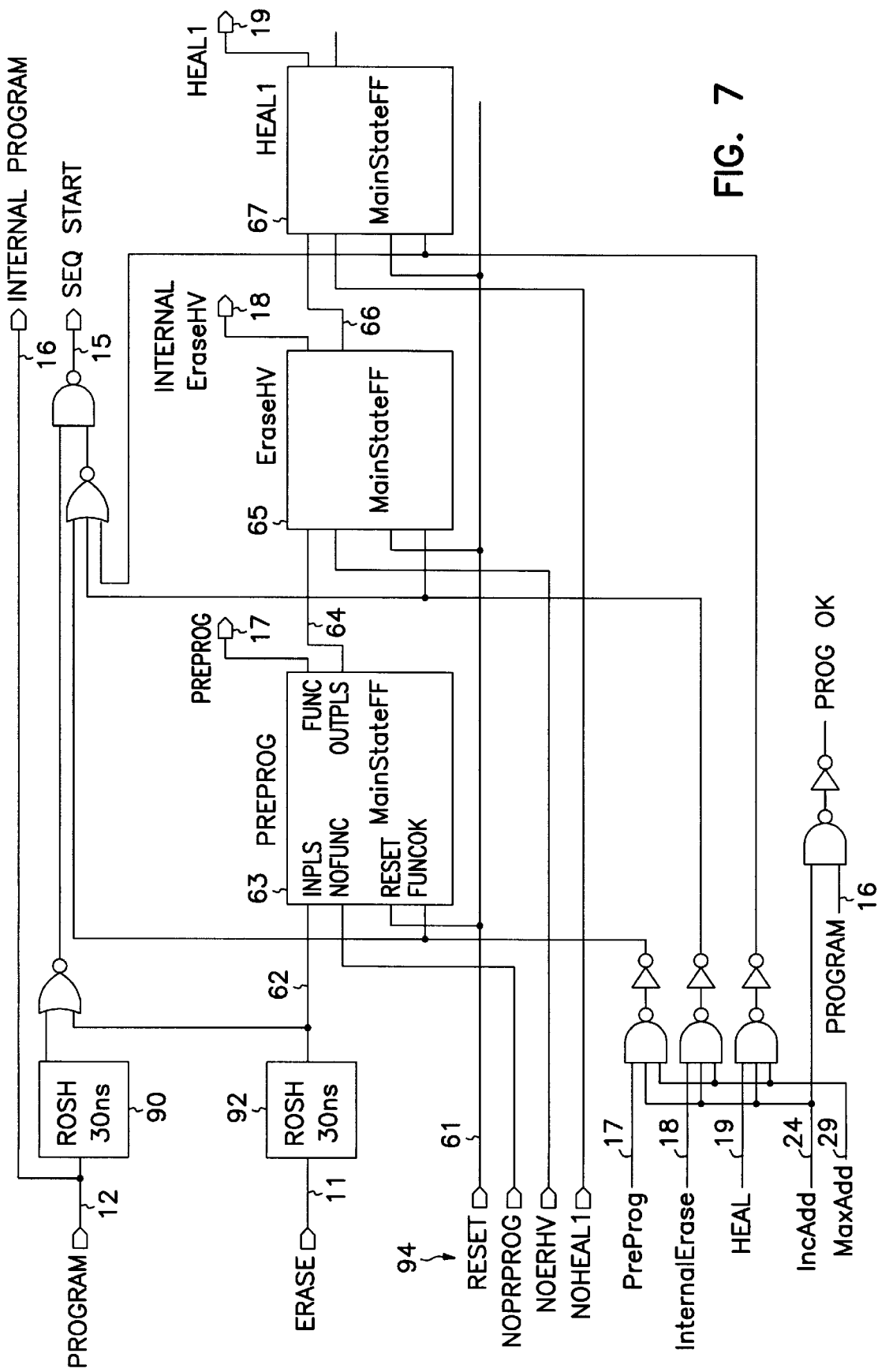
FIG. 7 is a schematic of the circuitry contained in the sequencer module of the state machine of FIG. 6.
Figure 8:
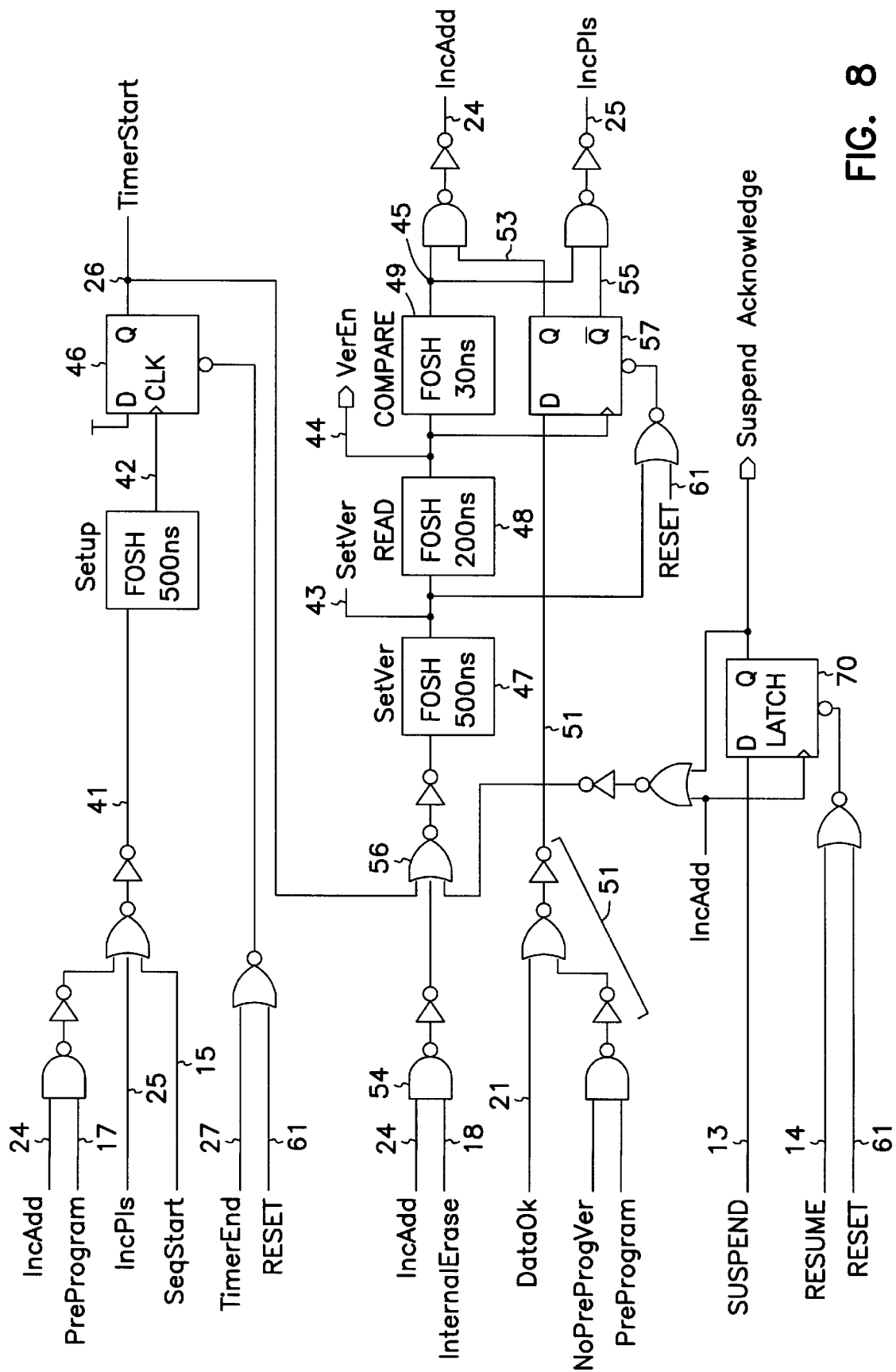
FIG. 8 is a schematic of the circuitry contained in the loop controller module of the state machine of FIG. 6.

FIG. 7 is a schematic of the circuitry contained in sequencer module 10 of state machine 1 of FIG. 6. FIG. 8 is a schematic of the circuitry contained in loop controller module 20 of state machine 1 of FIG. 6. As an example of the operation of the state machine of the present invention, the execution of a typical programming and typical erase operation will be described with reference to FIGS. 7 and 8.

As noted, starting with the memory system in a read or idle state, a command is issued by an external microprocessor to initiate the execution of a program or erase operation. A programming operation is one in which a byte or word at a particular location is written with specified data, while an erase operation will cause all the bytes or words of a block of data to be programmed to a logic value of 1 on each bit.

For example, in order to program a memory cell having the address AAAA with a set of input data, the following sequence of events occurs. A program command 12 from the microprocessor triggers a one-shot 90 that creates a pulse which will feed through the indicated logic gates to generate sequence start signal 15. This command also generates internal program signal 16. Sequence start signal 15 initiates loop controller module 20, which generates the necessary signals to control the high voltage and analog circuits which produce the pulses used to program a memory cell.

As shown in FIG. 8, sequence start signal 15 triggers a one-shot 41 on the falling edge, producing an output signal 42, which falls 500 ns (nano-seconds) later. Output signal 42 sets the output 26 of D-flipflop 46 high. Output signal 26 of flipflop 46 starts timer module 30 and also initializes the high voltage circuitry used for programming the memory cell. In a program mode of operation, the timer circuitry waits 6 $\mu$s and then generates timer end pulse 27. Timer end pulse 27 is gated with reset signal 61 to reset D-flipflop 46.

Output signal 26 is input to gate 56 which controls the triggering of a series of three one-shots, 47, 48, and 49, which provide control signals for the equipment used to verify, read and compare the data programmed into a cell during a pre-program or programming operation. When output signal 26 goes low, the output of gate 56 triggers a falling edge one-shot 47, which produces a pulse 43 which falls 500 ns later. The falling edge of output signal 43 of one-shot 47 is used to prepare analog circuitry used for programming the cells to change from programming voltage levels to data verify levels on nodes controlling the cells being programmed.

The falling edge of output signal 43 triggers one-shot 48, which produces a pulse 44 which falls 200 ns later. The falling edge of output signal 44 triggers one-shot 49, which produces a pulse 45 which falls 30 μs later. This combination of 3 one-shots, 47, 48 and 49, generates output signals 43, 44 and 45, respectively, which are used to trigger the data verify phase, set the necessary analog signals to the proper programming verify levels and then read the data programmed, and compare that data with the input data.

A comparator (not shown) controlled by output signal 45 of one-shot 49 will issue a Data OK signal 21 having a logic value of 1 if the comparison of all the bits being programmed matches the input data, and a signal having a value of 0 otherwise. Data OK signal 21 is input to loop controller 20 and gated with other signals through logic gates 52 to implement different control options. For instance, during a programming operation, signal 21 is passed through logic gates 52 to node 51 which serves as an input to D-flipflop 57. The output of D-flipflop 57 is signal 53 whose level is set by the input signal level at node 51.

If Data OK signal 21 is low (indicating that the programming operation was unsuccessful), inverted output 55 of D-flipflop 57 is gated with output 45 of one-shot 49 to produce increment pulse signal 25. Signal 25 increments pulse counter 40 of FIG. 6. This is done in order to track the number of pulses delivered while re-trying the programming operation using another voltage pulse. Signal 25 is gated and input to one-shot 41 to trigger a new cycle, which will start with a timer start pulse from node 26 and verify signals from nodes 43, 44 and 45. This sequence can be repeated, with each cycle sending a pulse to the cells to program them and then performing new data verification and compare operations. During each cycle, the pulse counter will be incremented. After a predetermined number of times, the value of which can be programmed into the pulse counter, the pulse counter will issue a maximum pulse counter signal 28. Maximum pulse counter signal 28 triggers reset signal 61, which will end the operation. This is done to prevent endless cycling of the state machine through the operation.

If Data OK signal 21 is high, the programming operation on the memory cell has been successful. Output 53 of D-flipflop 57 will be gated with output 45 of one-shot 49 to produce increment address pulse 24, which is input to address counter 50 to increment the stored address ("AAAA" in this example).

In the program mode, internal program signal 16 and increment address signal 24 will be gated together in address counter 50 (see FIG. 11) to produce a high value for maximum address signal 29. This signal is gated with internal program signal 16 to produce a Program OK signal. Maximum address signal 29 will also trigger a reset signal 61 which will end the programming operation.

The next example to be described is one in which an erase operation is to be executed under the control of the state machine of the present invention. An erase command 11 issued by the external microprocessor will trigger one-shot 92, which will produce an output pulse 62 which falls 30 ns later. The falling edge of output pulse 62 sets the pre-programming main state flip-flop 63 (see FIG. 7), which in turn will set outputs 17 (the pre-programming operation control signal) and 64 high. The previous activities set the memory system into the pre-program mode, which is the first stage in an erase operation. The one-shot output at node 62 is gated with pre-program command signal 17 to shape the sequence start pulse 15 applied to loop controller 20.

It is noted that gates 94 may be added to provide for special modes of operation where it is desired to skip some of the steps in the erase operation. For example, the pre-programming, high voltage erase, or healing stages may be bypassed by application of the appropriate bypass command to gates 94. These bypass commands are routed to the no function input of the main state flipflops 63, 64, and 65, respectively, in order to prevent execution of that operation. Another method by which certain of the stages of operation of a state machine which controls a memory system can be bypassed is discussed in U.S. patent application Ser. No. 08/508,921, entitled "Memory System Having Programmable Flow Control Register", filed Jul. 28, 1995, now U.S. Pat. No. 5,619,453 and the contents of which are hereby incorporated in full by reference.

Figure 9:
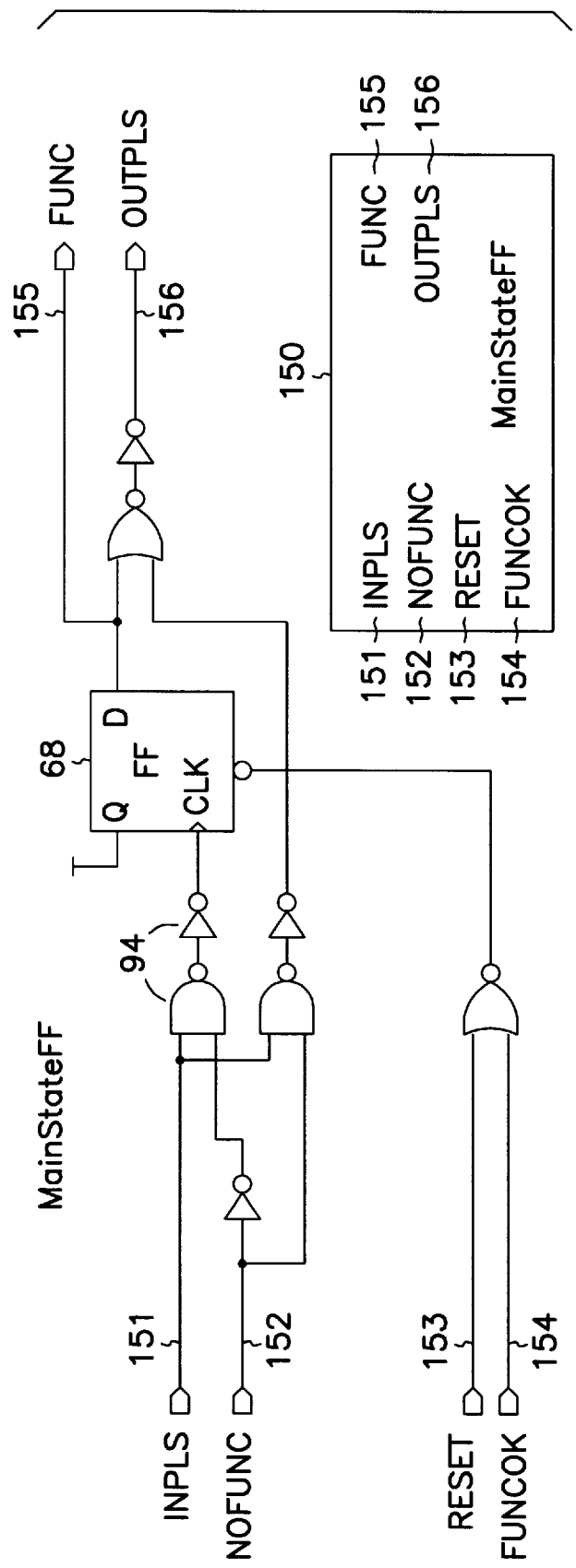
FIG. 9 is a schematic of one of the main state flipflops contained in the circuitry of the sequencer module of FIG. 7.

FIG. 9 is a schematic of one of the main state flipflops shown in the circuitry of sequencer module 10 of FIG. 7. The flipflop circuitry of FIG. 9 is the main element of sequencer module 10 and a number of such circuits are serially connected to sequence the different primary sub-operations. The purpose of the circuitry of FIG. 9 is to set a latch or flipflop while a particular function is enabled, and to reset the latch or flipflop otherwise. The inputs and outputs of main state flipflops 63, 65, and 67 of FIG. 7 are shown in box 150 of FIG. 9. As indicated, the inputs are input pulse signal 151, no function signal 152, reset signal 153, and function ok signal 154. The outputs are function trigger signal 155 and output pulse signal 156.

If the function controlled by the main state flipflop is to be executed, no function signal 152 will be low. The falling edge of input pulse signal 151 will be present at the clock input of a D-flipflop (flipflop 68 in this example). As shown in the figure, input pulse signal 151 is gated with an inverted no function signal 152 and used to trigger the D-flipflop. This will set the Q output of the flipflop to the value at its input D. This input is hard-wired to the positive power supply, thereby causing the Q output to be set to a high value (1). When loop controller module 20 outputs a signal that the operation has been completed, the function ok signal 154 will go high and reset the D-flipflop. This will terminate the operation being executed and set function signal 155 low (a value of 0). Output pulse signal 156 has the same shape as function signal 155 and is used to trigger the main state D-flipflop for the next operation.

If the operation controlled by a main state flipflop is to be skipped, gates 94 will prevent input pulse signal 151 from reaching the appropriate clock input of the flipflop, and function signal 155 will remain low. In order to continue with the sequence of operations after the skipped operation, gates 94 will route input pulse signal 151 to output pulse signal 156. This signal will be used to trigger the main state flipflop for the next operation.

In the following erase operation example, a pre-program operation without a data verify stage will be described. This is because a data verification operation during a program operation has been described in the previous program operation example, and the two verification operations are similar.

Sequence start signal 15 triggers one-shot 41 on the falling edge, producing output signal 42, which falls 500 ns later. Output signal 42 sets output 26 of D-flipflop 46 high. Output signal 26 starts timer module 30 and initializes the high voltage circuitry used for a pre-programming operation. In a pre-program operation, pre-program signal 17 causes the timer circuitry to wait 6 μs and then generate a timer end pulse 27. Timer end pulse 27 is gated with reset signal 61 to reset D-flipflop 46.

Output signal 26 is also input to gate 56 to produce the input for one-shot 47. This initiates the data verification cycle (verify setup, read the data in a cell, and compare the data to a desired value) which includes one-shots 48 and 49.

Since in the erase mode of this example we are not executing a data verification operation, a no pre-program verification signal (signal 72 of FIG. 8) is gated through gates 52 to set node 51 high. This will cause output 53 of D-flipflop 57 to be set high. This output signal is gated with output signal 45 of one-shot 49 to produce increment address signal 24. This will cause the memory cell address to be incremented.

Increment address signal 24 is input to gate 54 to initiate a new cycle of the pre-programming operation for the next memory cell address. Thus, a new loop will be started and the next byte will be programmed. This cycle will continue until the maximum address value signal 29 is produced. Maximum address value signal 29 is gated with pre-program signal 17 to produce a Pre-program OK signal (see FIG. 9 and the inputs to pre-programming flipflop 63 of FIG. 7). When this signal is high, the pre-program operation has been successfully executed and it is terminated.

A high value for the Pre-program OK signal resets pre-programming flipflop 63, and acts to trigger sequence start signal 15. It also generates an output signal 64 of stage 63 which is provided as an input to erase high voltage stage 65. This initiates the internal high voltage erase operation, and internal erase signal 18 is output by stage 65 and hence by sequencer 10. During this operation, a high voltage pulse will be used to perform a block erase on a block of memory cells. If successful, this will cause each cell in the block to be erased to a logic value of 1.

Sequence start signal 15 again triggers one-shot 41 on the falling edge, producing output signal 42, which falls 500 ns later. Output signal 42 sets output 26 (timer start signal) of D-flipflop 46 high. Output signal 26 of flipflop 46 starts timer module 30 and also initializes the high voltage circuitry used for erasing the memory cell. Since internal erase signal 18 is high, timer 30 will generate a pulse which will fall after a 10 ms (milli-seconds) time period. This pulse will reset output 26. On the falling edge of output 26, gate 56 will trigger the data verification sequence which will read the data from each cell and compare it to FF (all bits having a value of 1, indicated an erased cell). If the verification sequence fails, Data OK signal 21 remains low at 0 and increment pulse counter signal 25 goes high and increments pulse counter 40.

This sequence can be repeated many times, each time sending an erase pulse to the block of cells to erase the cells and then verifying and comparing the data in each cell to determine if the erase operation was successful. Each time the operation fails, pulse counter 40 will be incremented by means of increment pulse counter signal 25. After a certain number of times, the value of which can be programmed into pulse counter 40, the counter will issue a maximum pulse counter signal 28. This signal will trigger reset signal 61 which will end the operation. On the other hand, if Data OK signal 21 is high, the verification of one byte at the erase level is successful, so the cell address can be incremented and the contents of the next byte can be verified.

In this case, logic gates 54 and 56 will act to trigger a new erase verify sequence, which will result in a new value for Data OK signal 21. This will continue until either the maximum pulse counter value is reached, in which case the erase operation failed and a reset signal 61 is issued, or the maximum address value is reached. In this case, the erase of the memory cell block was successful and the maximum address value signal 29 goes high and triggers a signal which resets erase stage 65 of sequencer 10 and sets healing stage 67. This initiates the heal operation, causing heal signal 19 to be produced.

During the heal operation, sequence start signal 15 again triggers one-shot 41 on the falling edge, producing output signal 42, which falls 500 ns later. Output signal 42 sets output 26 of D-flipflop 46 high. Output signal 26 of flipflop 46 starts timer module 30 and also initializes the high voltage circuitry used for the healing operation. Since heal signal 19 is high, timer module 30 will issue a pulse which falls after a 100 ms time period. This pulse will reset output 26 and start the data verify sequence. Since the verification operation is disabled in this example during a heal operation, a signal will set node 51 high by means of gates 52.

The signal at node 51 will set output 53 of flipflop 57 high, and trigger increment address signal 24 which will increment the memory cell address. Increment address signal 24 in combination with heal signal 19 will trigger maximum address signal 29 (see FIG. 11) and set the Heal OK bit, which will conclude the heal operation, and hence the entire erase operation.

It is noted that during an erase operation, suspend 13 and resume 14 commands can be issued to control loop controller 20. The loop controller circuitry of FIG. 8 includes a latch 70 that will be set by increment address signal 24 if suspend signal 13 is high, and is reset by resume signal 14. The output of latch 70 will keep increment address signal 24 high and prohibit execution of any functions until a resume command is issued.

Figure 10:
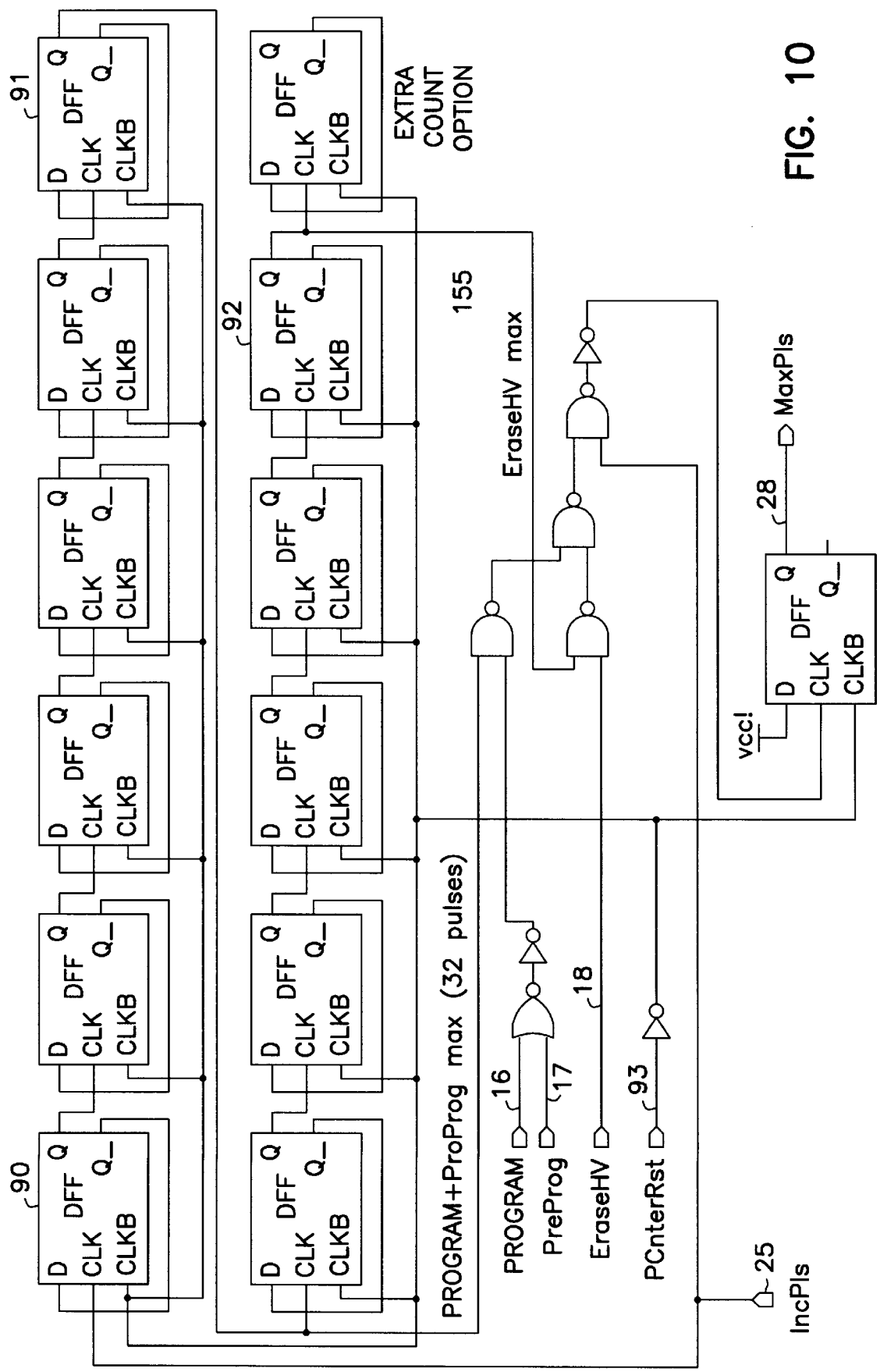
FIG. 10 is a schematic of the circuitry contained in the pulse counter module of the state machine of FIG. 6.

FIG. 10 is a schematic of the circuitry contained in pulse counter module 40 of state machine 1 of FIG. 6. Pulse counter module 40 contains circuitry which includes a series of dividers by 2 connected serially, with the first divider 90 being triggered by increment pulse counter signal 25, which functions as a clock signal for the module. During a program or pre-program operation, the output of pulse counter module 40 will be triggered by 6th divider 91. This means that after 64 pulses, maximum pulse count signal 28 will be set high. During an internal erase operation, the output of pulse counter module 40 will be triggered by 11th divider 92. This means that 1024 increment pulse signals are necessary to set maximum pulse count signal 28 high in this mode of operation. Note that the output of pulse counter module 40 is controlled by the internal program 16, pre-program 17, and erase high voltage 18 signals which are gated in various combinations to trigger production of maximum pulse count signal 28 after an appropriate number of pulses.

The logic gates to which the internal program 16, pre-program 17, and erase high voltage 18 signals are input function as a multiplexer to select which output of pulse counter 40 will trigger maximum pulse signal 28. If the program 16 or pre-program 17 signal is high, the output of 6th divider 91, which will be high after increment pulse signal 25 toggles 64 times, will act to set maximum pulse count signal 28 high. If erase high voltage signal 18 is high, the output of 11th divider 92, which will be high after increment pulse signal 25 toggles 1024 times, will act to set maximum pulse count signal 28 high. Pulse counter reset signal 93 is input as shown and used to initialize the pulse counter to a value of 0 before each program or erase operation by resetting all flipflops to 0.

Figure 11:
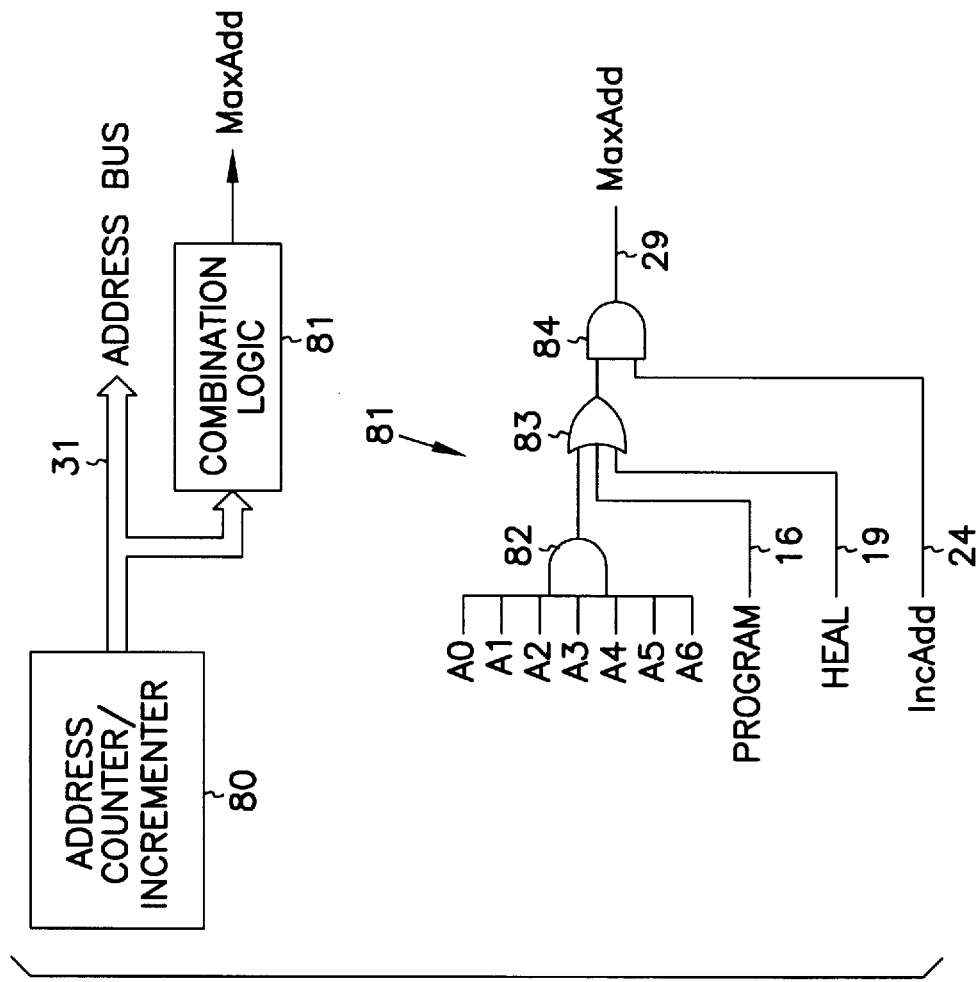
FIG. 11 is a schematic of the circuitry contained in the address counter module of the state machine of FIG. 6.

FIG. 11 is a schematic of the circuitry contained in address counter module 50 of state machine 1 of FIG. 6. Address counter module 50 includes address counter/incrementer module 80 which is used with combination logic module 81 to produce the memory cell addresses output on address bus 31 and maximum address signal 29. As indicated in FIG. 11, when inputs A0–A6 of address pins 113 are high (meaning that all addresses in the memory block have been stepped through and checked), the output of gate 82 is high. This means that one of the inputs to gate 83 is high. If the state machine is in the program 16 or heal 19 mode of operation, then another input to gate 83 is high. If any input of gate 83 is high, then an input to gate 84 is high. If the increment address signal 24 is active (high), then the circuitry of FIG. 11 will output maximum address value signal 29 which is used as a control signal to terminate certain of the stages of operation of the state machine (see FIG. 7).

FIG. 12 is a table showing how the primary data processing operations performed on a memory system can be implemented by using a common set of sub-operations controlled by the state machine of the present invention. The figure shows how the primary high level operations of programming and erasing can be implemented by controlling the execution of the sub-operations (initialize, setup high voltage, etc.) listed under the "step" heading in the figure. The erase operation is broken up into pre-program (with or without data verification), internal erase, and post-erase processing sub-operations. The figure indicates the circuitry used to implement each of the sub-operations, as well as any relevant parameters for controlling that sub-operation.

For example, to execute a programming operation, the figure indicates that the address counter is set to 0 and the pulse counter to 0 during the initialization stage. During the high voltage setup stage, the high voltage supplies and voltage regulators are controlled to cause the voltage supplies to produce a programming voltage (Vp) of 11 volts on the gate of the memory cell being programmed, and a voltage of 6 volts on the source of the memory cell. During the activate high voltage pulse stage, the timer is controlled to produce a 6 μs pulse which triggers production of the programming voltage pulse. During the setup verify stage, the voltage supplies are controlled to produce a voltage of 6 volts on the gate of the memory cell being programmed, and a ground potential on the source of the memory cell. The programmed data is compared to the input data during the compare stage. The increment pulse stage sets the maximum address value for the pulse counter to 64 and the increment address stage sets the maximum value for the address to 1 for the programming stage. When the maximum address value is reached (after successfully programming a designated memory cell and incrementing the counter), the programming operation is terminated. Note that if no verification stage is desired, the output of the verify comparator can be forced to a value of 1. Similarly, if only one voltage pulse is desired, the maximum address value can be set to the initial address.

Figure 3:
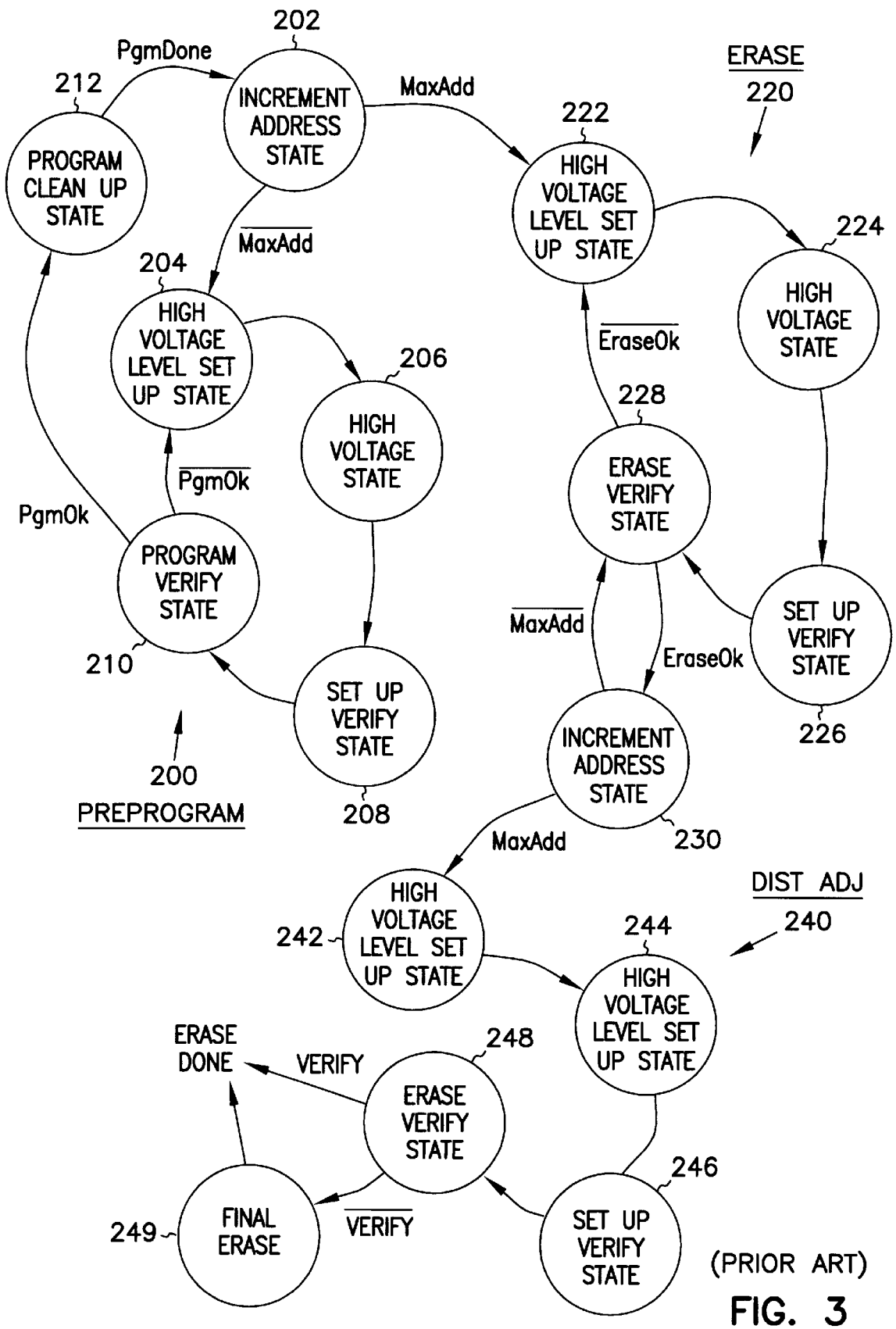
FIG. 3 is a state diagram showing the states of the erase state machine of FIG. 2 in greater detail, and in particular the states of the pre-program, erase high voltage, and healing state machines shown in that figure.
Figure 4:
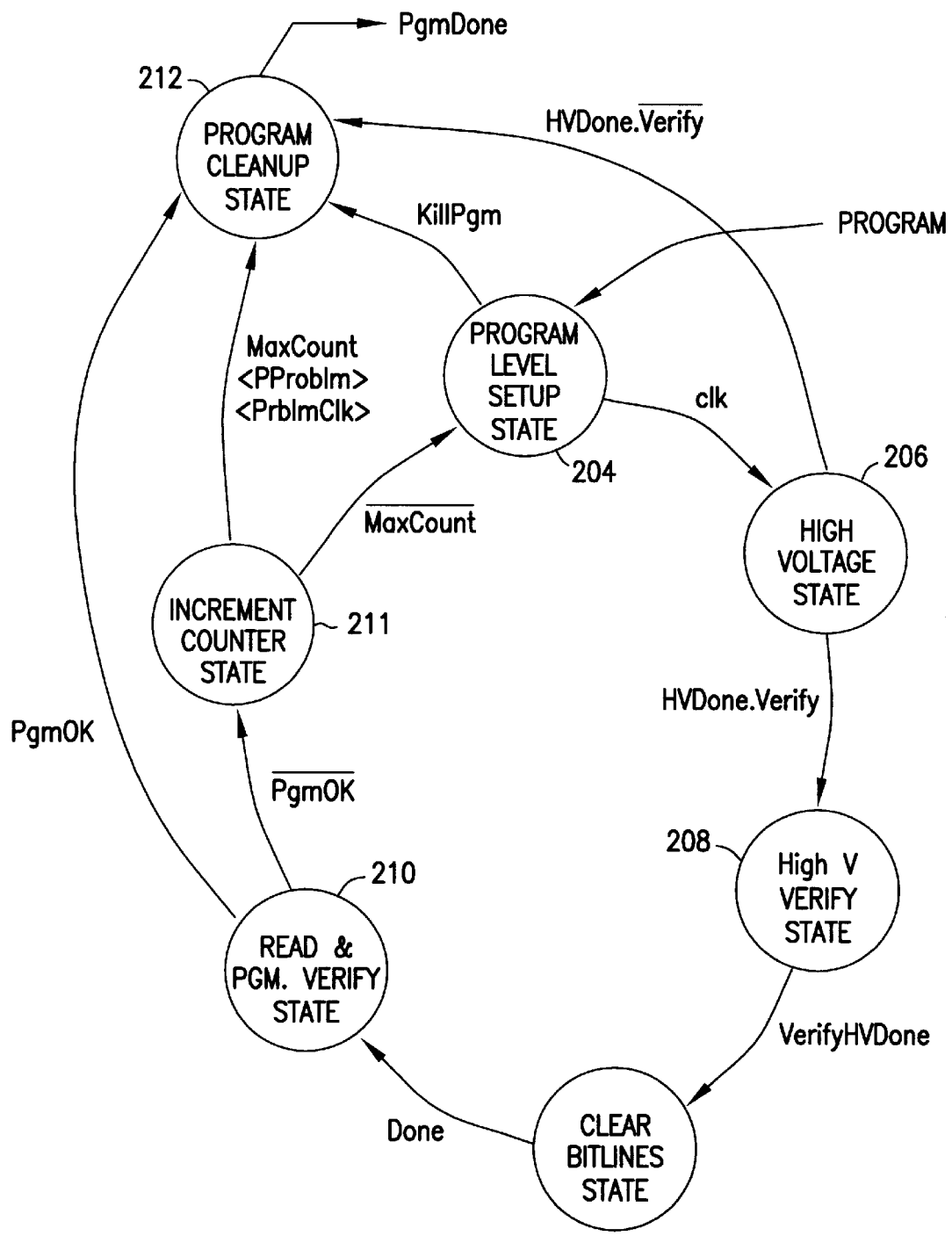
FIG. 4 is a state diagram showing the states of a program state machine during the performance of a programming operation on a memory system such as that shown in FIG. 1.

The inventor of the present invention has recognized that the other operations shown in FIG. 12 can similarly be executed by varying the value of the parameters of each of the sub-operations as indicated. Thus, the control signals to the modules which implement the same set of basic sub-operations can be varied in order to execute the stages of either a programming or erase operation. This permits the construction of a more compact state machine which has great flexibility, but a lower gate count than the set of state machines typically used in a memory system. For example, whereas it was previously noted that an implementation of the state machines shown in FIGS. 3 and 4 would require a total of 400 to 500 gates, an implementation of the state machine of the present invention would require approximately 10 states (see FIGS. 5 and 7), and with 20 gates per state, this would give a total gate count of approximately 200 gates.

As a further example, in executing an internal erase sub-operation as part of an overall erase operation, the control parameters are set as shown in FIG. 12. The high voltage supplies receive control signals which set the output to produce a voltage of 10 volts on the source of the cells being erased, and the timer is controlled to produce a timer end pulse after 10 ms. The setup verify stage is carried out by the same module, but with control signals which cause the high voltage supplies to produce a voltage of $V_{CC}$ (the power supply voltage) on the gates of the cells. During the compare stage, the same modules are used but the data is compare to a value of FF instead of the input data, as in the case of the programming operation. The maximum value for the pulse counter and for the address value are also altered as indicated.

As discussed, in the state machine of the present invention, common sub-operations which are used in different higher level operations are implemented by the same functional module(s), whose outputs are varied by control signals. In this manner, the high voltage setup stage, high voltage pulse stage, verification setup stage, and data verification stage (among others) used in either a programming or erase operation can be executed by a common set of modules. This eliminates the duplicated functional modules found in most state machines typically used to control memory systems. As a result, the number of logic gates needed to implement the state machine is reduced compared to what would be required for a state machine in which such duplicate modules were present. This reduces the size and cost of the state machine.

Another benefit of the state machine architecture of the present invention is that it uses a central controller (the sequencer module) to control a set of modules which implement the sub-operations which are combined to execute a higher level operation. This architecture permits the sub-operations to be executed in any order desired, including the skipping of stages (data verification, for example) if desired, with minimal additional circuitry (logic gates 94 of FIG. 7). This permits the process flow to be varied to a greater degree than is possible in a state machine architecture in which the sub-operations are executed in a defined sequence, with control passing from one sub-operation to the next.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A memory system comprising:

an array of memory cells; and a state machine which controls operation of the memory system in response to program and erase instructions from a source to execute a program or erase operation on the memory cells in the array, the erase operation including pre-program, high voltage erase, and healing sub-operations, the program operation including programming voltage level setup, high voltage pulse, and programmed data verification functions, the erase sub-operations including erase voltage level setup, high voltage pulse, and erase data verification functions, the state machine further comprising:

a sequencer having an input and an output, the sequencer controlling the order and timing of the programming operation and the sub-operations executed during erasing operations, the sequencer input being a command to execute a memory operation from the source, the sequencer output being a sub-operation start signal to initiate the execution of a sub-operation and a signal representing the sub-operation to be executed; and a single controller having an input and an output, the controller controlling the order and timing of both the functions executed during the programming operation and the functions executed during the erase operation sub-operations, the controller input being the outputs of the sequencer and the controller output being a signal for controlling a voltage source for supplying the high voltage pulse used for the programming and erasing operations, the controller further comprising:

a verification state latch containing a single logic element which is set when the programmed data verification function is active and when the erased data verification function is active.

2. The memory system of claim 1, further comprising:

a data verification circuit for verifying that the data written to a memory cell during a programming, pre-programming, and high voltage erase operation is correct.

3. The memory system of claim 2, wherein the controller outputs signals for controlling the operation of the data verification circuit when executing programming and erase operations.

4. The memory system of claim 2, wherein the data verification circuit includes a data read circuit for reading data in a memory cell after a programming, pre-programming, and erase operation and a comparator for comparing the read data to a correct data.

5. The memory system of claim 1, wherein the state machine further comprises:

a pulse counter for counting a number of voltage pulses applied to a memory cell block and memory cell during a programming, pre-programming, and erase operation.

6. The memory system of claim 5, wherein the controller outputs signals for controlling the operation of the pulse counter when executing programming and erase operations.

7. The memory system of claim 1, wherein the state machine further comprises:

an address counter for incrementing an address of a memory cell on which a pre-programming or erase verify operation is being executed.

8. The memory system of claim 7, wherein the controller outputs signals for controlling the operation of the address counter when executing programming and erase operations.

9. A memory system comprising:

an array of memory cells; and a state machine which controls operation of the memory system in response to program and erase instructions from a source to execute a program or erase operation on the memory cells in the array, the erase operation including pre-program, high voltage erase, and healing sub-operations, the program operation including programming voltage level setup, high voltage pulse, and programmed data verification functions, the erase sub-operations including erase voltage level setup, high voltage pulse, and erased data verification functions, the state machine further comprising:

a sequencer having an input and an output, the sequencer controlling the order and timing of the programming operation and the sub-operations executed during erasing operations, the sequencer input being a command to execute a memory operation from the source, the sequencer output being a sub-operation start signal to initiate the execution of a sub-operation and a signal representing the sub-operation to be executed; and a single controller having an input and an output, the controller controlling the order and timing of both the functions executed during the programming operation and the functions executed during the erase operation sub-operations, the controller input being the outputs of the sequencer and the controller output being a signal for controlling a voltage source for supplying the high voltage pulse used for the programming and erasing operations, the controller further comprising:

a pulse state latch containing a single logic element which is set when the program high voltage pulse sub-operation is active and when the erase high voltage pulse sub-operation is active.

10. The memory system of claim 9, further comprising:

a data verification circuit for verifying that the data written to a memory cell during a programming, pre-programming, and high voltage erase operation is correct.

11. The memory system of claim 10, wherein the controller outputs signals for controlling the operation of the data verification circuit when executing programming and erase operations.

12. The memory system of claim 10, wherein the data verification circuit includes a data read circuit for reading data in a memory cell after a programming, pre-programming, and erase operation and a comparator for comparing the read data to a correct data.

13. The memory system of claim 9, wherein the state machine further comprises:

a pulse counter for counting a number of voltage pulses applied to a memory cell block and memory cell during a programming, pre-programming, and erase operation.

14. The memory system of claim 13, wherein the controller outputs signals for controlling the operation of the pulse counter when executing programming and erase operations.

15. The memory system of claim 9, wherein the state machine further comprises:

an address counter for incrementing an address of a memory cell on which a pre-programming or erase verify operation is being executed.

16. The memory system of claim 15, wherein the controller outputs signals for controlling the operation of the address counter when executing programming and erase operations.

* * * * *